(12) United States Patent
Kabulepa et al.

(10) Patent No.: US 8,347,150 B2
(45) Date of Patent: Jan. 1, 2013

(54) METHOD AND SEMICONDUCTOR MEMORY WITH A DEVICE FOR DETECTING ADDRESSING ERRORS

(75) Inventors: Lukusa Didier Kabulepa, Erzhausen (DE); Houman Amjadi, Karsruhe (DE); Wolfgang Fey, Bodolz (DE); Adrian Traskov, Steinbach (DE)

(73) Assignee: Continental Teves AG & Co., oHG (DE)

( * ) Notice: Subject to any disclaimer, the term of this patent is extended or adjusted under 35 U.S.C. 154(b) by 128 days.

(21) Appl. No.: 12/517,654

(22) PCT Filed: Dec. 5, 2007

(86) PCT No.: PCT/EP2007/063367
§ 371 (c)(1),
(2), (4) Date: Dec. 1, 2009

(87) PCT Pub. No.: WO2008/068290
PCT Pub. Date: Jun. 12, 2008

(65) Prior Publication Data
US 2010/0107006 A1   Apr. 29, 2010

(30) Foreign Application Priority Data

Dec. 7, 2006 (DE) .......................... 10 2006 057 700
Dec. 5, 2007 (DE) .......................... 10 2007 058 928

(51) Int. Cl.
G06F 11/26 (2006.01)
G06F 11/00 (2006.01)

(52) U.S. Cl. .............. 714/53; 714/6.1; 714/42; 711/200

(58) Field of Classification Search ................... 714/6.1, 714/42, 53; 711/200, 201
See application file for complete search history.

(56) References Cited

U.S. PATENT DOCUMENTS

| | | | |
|---|---|---|---|
| 3,049,692 A | 8/1962 | Hunt | |
| 4,912,710 A | 3/1990 | Rolfe | |
| 5,574,690 A | 11/1996 | Kesel et al. | |
| 6,457,067 B1 * | 9/2002 | Byers et al. | 714/53 |
| 6,754,858 B2 | 6/2004 | Borkenhagen et al. | |
| 7,301,837 B2 | 11/2007 | Demange | |
| 7,418,636 B2 * | 8/2008 | Driediger | 714/53 |

(Continued)

FOREIGN PATENT DOCUMENTS

DE    43 17 175 A1    11/1994

(Continued)

OTHER PUBLICATIONS

Nicolaidis M: "Efficient UBIST Implementation for Microprocessor Sequencing Parts", Journal of Electronic Testing, Kluwer Academic Publishers, Dordrecht, NL, Bd. 6, Nr. 3, Jun. 1, 1995, pp. 295-312.

*Primary Examiner* — Joseph D Manoskey
(74) *Attorney, Agent, or Firm* — RatnerPrestia

(57) ABSTRACT

A semiconductor memory and a data processing system having hardware for carrying out a method for the improved internal monitoring of addressing circuits in semiconductor memories or in a data processing system, in which logic levels addressing lines are tapped off, the actually selected address or subaddress is represented by additional address bit lines, the actually accessed address/subaddress is recovered using the address bit lines, and the actually selected address/subaddress is compared with the applied address/subaddress, obtained from the additional address bit lines, in order to recognize an error in the addressing circuit.

18 Claims, 6 Drawing Sheets

U.S. PATENT DOCUMENTS

| | | | |
|---|---|---|---|
| 7,532,526 B2 * | 5/2009 | Katrak et al. | 714/53 |
| 2003/0163767 A1 * | 8/2003 | Phelps | 714/42 |
| 2004/0237001 A1 * | 11/2004 | Schulz et al. | 714/42 |
| 2006/0156193 A1 * | 7/2006 | Demange | 714/763 |
| 2007/0002616 A1 | 1/2007 | Wuidart et al. | |
| 2009/0037782 A1 * | 2/2009 | Hughes | 714/53 |

FOREIGN PATENT DOCUMENTS

| | | |
|---|---|---|
| EP | 0 451 985 A2 | 10/1991 |
| EP | 1 662 511 A | 5/2006 |

* cited by examiner

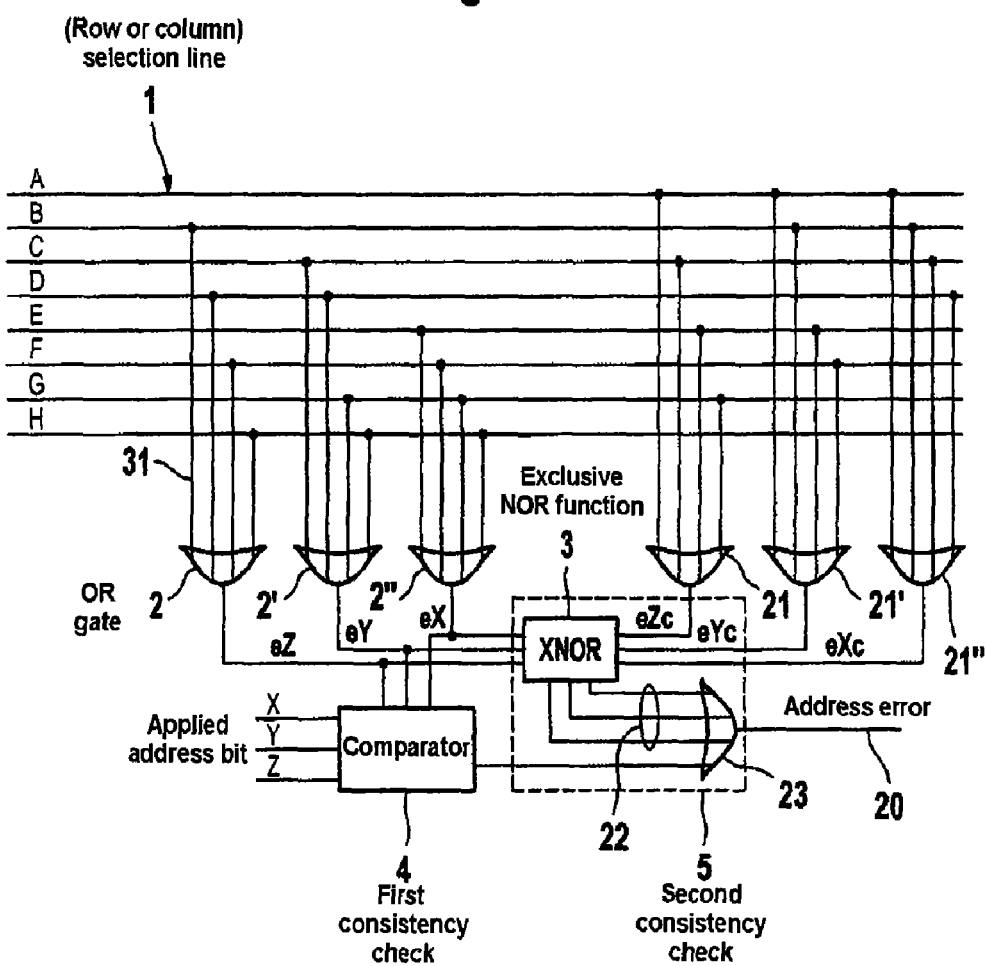

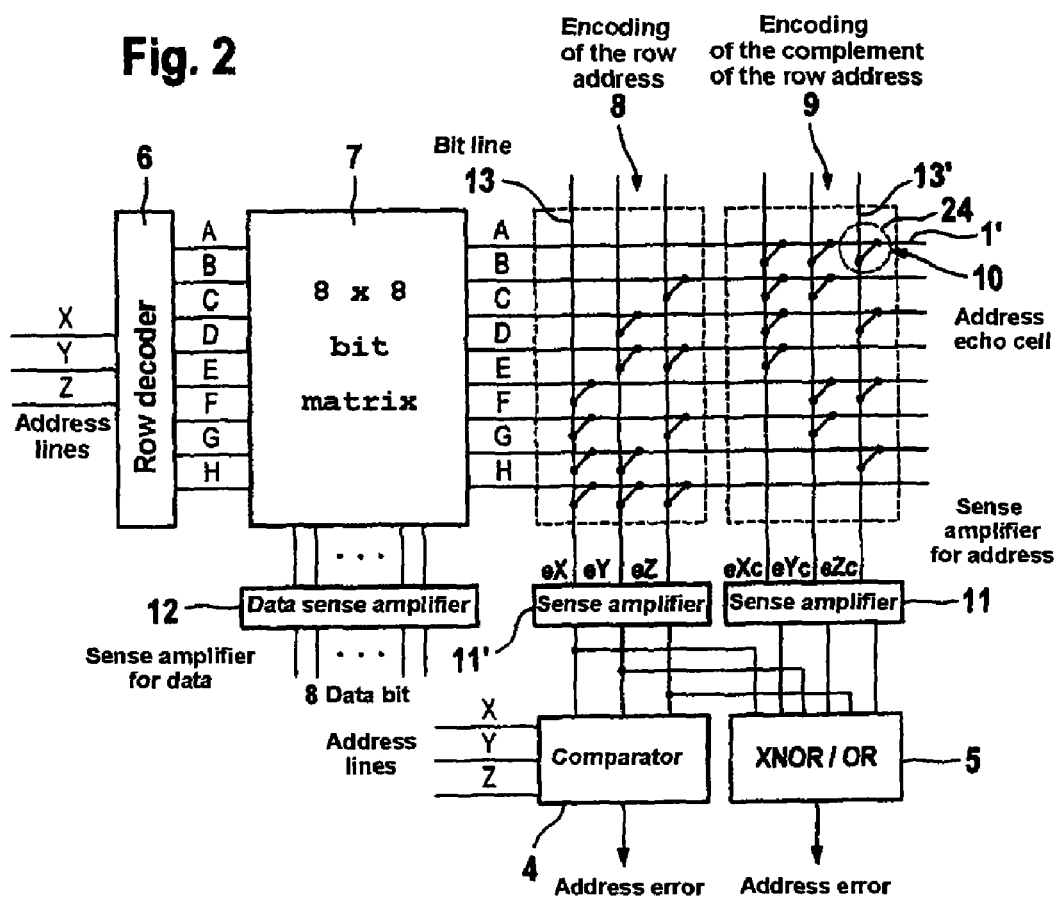
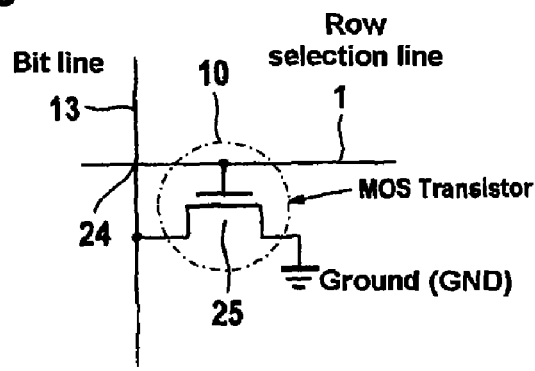

METHOD AND SEMICONDUCTOR MEMORY WITH A DEVICE FOR DETECTING ADDRESSING ERRORS

CROSS REFERENCE TO RELATED APPLICATIONS

This application is the U.S. national phase application of PCT International Application No. PCT/EP2007/063367, filed Dec. 5, 2007, which claims priority to German Patent Application No. DE102006057700.0, filed Dec. 7, 2006 and German Patent Application No. DE102007058928.1, filed Dec. 5, 2007, the contents of such applications being incorporated by reference herein.

BACKGROUND OF THE INVENTION

1. Field of the Invention

The invention relates to a method for the internal monitoring of addressing circuits in semiconductor memories or data processing systems and to a semiconductor memory or a data processing system for carrying out the method.

2. Description of the Related Art

Error monitoring methods in semiconductor memories are known which can be used to recognize and possibly correct errors in data bits loaded in memory cells. These inherently known monitoring methods can recognize erroneous memory cell contents with a very high degree of coverage. This involves the use of error-recognizing and error-correcting codes such as ECC (Error Correction Codes), for example. For the protection of addressing circuits in semiconductor memories, these known methods cannot readily be used, however.

It is known that addressing circuits can be monitored by incorporating address bits into the calculation of redundant bits. However, this principle does not recognize addressing errors which were already present before the write address. By way of example, if a defective address decoder selects an incorrect word line, the word to be written is stored at an incorrect address. Upon subsequent read access using the same destination address, the word is read without the error which has occurred being recognized by means of the redundant bits calculated for the address.

In the method described in U.S. Pat. No. 6,754,858, error-recognizing and error-correcting codes are calculated and stored for the write addresses in synchronous dynamic RAM stores (SDRAM: Synchronous Dynamic Random Access Memory). To this end, a bit pattern is generated and also stored for a succession of write access operations. The value of this bit pattern is dependent on the individual write addresses and also on the order thereof. For the purpose of error recognition, a succession of read access operations is followed by comparison of a modeled bit pattern with the stored bit pattern. Errors which occur or are present in the addressing circuits usually prompt errors in a plurality of bits. The error recognition rate for multibit errors is too low for safety-critical applications, however.

In addition, the error recognition in line with U.S. Pat. No. 6,754,858 is based on the assumption that the addressing circuits are error-free during a write access operation. Particularly in the case of volatile memories, however, errors occur with not negligible frequency even in this case. In the case of nonvolatile memories, such as Flash ROMs, on the other hand, it is possible to check the memory in offline operation, which is unrewarding in the case of volatile memories.

In the self-test device for memories which is described in DE 43 17 175 A1, word lines are monitored by means of a current sensor. A current flowing through the sensor line is intended to indicate an error if a plurality of selection lines are activated simultaneously. However, the circuit arrangement described cannot recognize an internal error in the address decoder if a single, incorrectly addressed word line is selected. In addition, the method described deals merely with the monitoring of word lines downstream of the address decoder and address lines upstream of the address decoder. The address decoder may likewise produce errors, however, in which a single incorrect word line is selected despite correctly applied address lines. This type of error is not recognized using the method described, since the method is designed to recognize the selection of a plurality of word lines.

In addition, the precaution described provides a robust functionality only if each word line is connected to the sensor line only at a single point, however, for example when $2^n$ test lines are being used for $2^n$ word lines. However, when monitoring $2^n$ word lines with n test lines, the problem of competing discharging and charging processes on the sensor line arises, the end result being dependent on many factors, such as on the address encoding of the word line under consideration, MOS process parameters and parasitic capacitances. If a word line is connected by a plurality of transistors on the sensor line, one transistor can discharge the sensor line on account of the error that is present while other transistors simultaneously charge the sensor line.

An incorrect word line selection can be recognized using the methods described in U.S. Pat. No. 4,912,710 and in the publication "Efficient UBIST Implementation for Microprocessor Sequential Parts", M. Nicolaidis, IEEE International Test Conference, June 1990. In U.S. Pat. No. 4,912,710, an incorrect word line selection is recognized by comparing the actually selected address and the applied address. Nevertheless, the method presented in U.S. Pat. No. 4,912,710 cannot recognize a short circuit between selection lines, which involves the address bits of one selection line masking the other address bits. An example which may be mentioned in this context is a short circuit between the word lines which are selected using the address bits "111111 ... 111" (all have the value one) and "110000 ... 000".

In the above publication by Nicolaidis, the actually selected address is identified using a simple code and not using the address bits which are to be expected. To ensure a high degree of coverage for the recognition of addressing errors, as few bit positions as possible in the codes have a logic value "1". In the case of the cited example with what are known as "1-of-n codes", each code comprises a single logic "1" value and a plurality of logic "0" values. Particularly in large memories, this method results in disadvantageously long codes, because the longer a code is the higher the hardware implementation costs of the method. By way of example, 1024 address test lines are required in order to monitor 10 address bits. Added to this also is the fact that testing the correspondence between the applied address and the recovered code becomes likewise more complex. For these reasons, the method described in the publication is also associated with a very high level of hardware implementation complexity.

SUMMARY OF THE INVENTION

The invention relates to an object of specifying a method which allows reliable error monitoring of addressing circuits and generally memory access operations in semiconductor memories without a high level of implementation complexity.

According to aspect of the invention, in order to recognize errors in the addressing circuit or in a selected addressing path, logic levels on the addressing lines, particularly on the terminations thereof, are first of all tapped off. In addition, the actually selected address or subaddress is represented is additional address bit lines. The actually accessed address/subaddress is then recovered using the address bit lines. By comparing the actually selected address/subaddress with the applied addresses/subaddresses, obtained from the additional address bit lines, it is finally possible to recognize errors in the addressing circuit or in a selected addressing path. In other words, the error recognition involves, by way of example, representation of the actually selected address by the externally reproduced address bits and comparison of the actually selected address with the applied address.

In line with the invention, error recognition involves tapping off the electrical signal on the addressing lines. This can preferably be done at the ends (terminations) of the row selection lines and/or the column selection lines for the memory cells.

The actually accessed address/subaddress is preferably recovered in the form of bit complements (logic complementary value). The comparison of the recovered address/subaddress and its complement is an internal consistency check for the recovery of the address/subaddress.

The method according to aspects of the invention affords the advantage that errors which occur can actually be recognized directly after a memory access operation. In addition, it is possible to recognize addressing errors not only after a read operation, as in previously known methods, but also after a write operation in the course of operation. A further advantage is that the error recognition method for recognizing addressing errors can be applied not only to the single error model but also to the recognition of multiple errors, such as short circuits between more than two addressing lines.

Particularly preferably, recovering the address/subaddress involves a first consistency check being performed between the recovered address/subaddress and the complement thereof and also a subsequent second consistency check being performed between the recovered and the applied address/subaddress, the second consistency check being performed particularly only in the event of successful conclusion of the first consistency check. The effect achieved by this is that the masking process for addresses and the complements thereof can proceed differently, and therefore different results are also possible.

On the basis of a first exemplary embodiment, the complemented and uncomplemented bits are processed such that the complemented and uncomplemented bits are supplied to OR gates. With particular preference, respective groups of complemented bits are supplied to a plurality of OR gates for the complement, and respective groups of uncomplemented bits are supplied to a plurality of OR gates for the uncomplemented signal. The outputs of the OR gates with the complement and the outputs with the uncomplemented signals are supplied particularly to one or more XNOR gates. The first exemplary embodiment is distinguished by low complexity of additional electronic components and is particularly advantageous for a small number of selection lines.

On the basis of a second exemplary embodiment, the complemented and uncomplemented bits are processed such that besides the memory matrix an additional encoding matrix and an additional complement encoding matrix are provided. The number of additional bit lines corresponds to twice the number of the address lines. The crossover points in these matrices contain address echo cells, particularly in a suitable manner. The address echo cells are preferably one or more semiconductor components which are connected up to the crossed lines forming the matrices such that signal bits or complement signal bits are produced. The second exemplary embodiment is advantageous when a large number of selection lines (for the rows and/or columns) are required in the memory. The second exemplary embodiment also allows particularly rapid processing with little clock cycle consumption, since the internal check on the addresses takes place at the same time as the memory cells are accessed. This allows the number of latent errors to be reduced in semiconductor memories, for example. Conventional monitoring methods mean that an error which has occurred as a result of corrupted addressing remains in the memory until it is recognized following a read access operation to the affected address. It is also advantageous that the complexity of test algorithms for semiconductor memories can be significantly reduced.

Preferably, the method involves the recovery of the actually accessed address also being monitored by virtue of an independent recovery of the binary complement of the actually accessed address being performed.

Preferably, addressing errors and data errors are distinguished explicitly and so as to be able to be recognized as such. This means that the method is appropriate as a suitable addition to the inherently known error recognition methods based on redundant bits, which have previously been used exclusively for error recognition in the data bit area.

In line with one exemplary variant of the method, the addressing check is performed in the same access cycle as a read or write operation. This means that the result of the error check is already available during the read or write cycle, which means that the reaction time in the case of an addressing error is kept very short. This advantage applies both to volatile and to nonvolatile semiconductor memories.

In line with another exemplary variant of the method, the read-back address actually accessed during a memory access operation and/or the complementary actually accessed read-back address is/are stored in a or a respective register. A memory access operation is considered error-free if the register content corresponds to the access address or to the complement of the access address.

The ever decreasing feature sizes from semiconductor processes result in volatile semiconductor memories becoming ever more susceptible to what are known as soft errors. Errors of this type, in which individual bits "overturn", are essentially caused by alpha particles or cosmic radiation. The rate of occurrence of soft errors can be estimated for a newly developed memory in advance by virtue of said memory being subjected to increased suitable irradiation. To date, test methods of this type have involved counting and logging all errors which occur. In this case, it is usually disregarded that addressing circuits and memory cells in a semiconductor memory that is present can be affected by soft errors in different ways. In accordance with one exemplary embodiment of the method, provision is therefore made for an explicit distinction to be drawn between soft errors in data bits and soft errors in the addressing circuits. A nonreproducible error is particularly preferably classified as a soft error in the addressing circuits precisely when the complementary and noncomplementary recovered addresses/subaddresses exhibit consistency and at the same time are not appropriate to the actually applied address, and a soft error is associated with a data bit if bit errors are recognized by means of an error recognition mechanism during proper recovery of the address/subaddress.

The invention also relates to a semiconductor memory or a data processing system which is designed particularly such that the error recognition method described further above is executed therein. The semiconductor memory, which is particularly part of the data processing system, comprises not only the addressing circuit as a core structure but also a memory matrix which is addressed by the addressing circuit.

The semiconductor memory according to aspects of the invention contains circuit means which allow internal recognition and of addressing errors by monitoring the addressing circuit contained therein. It is preferable for recognition means for memory errors also to be present in addition to said recognition means for addressing errors.

The semiconductor memory according to aspects of the invention with error monitoring also preferably has an addressing circuit having at least one feedback path for the monitoring. This achieves an improvement in the error monitoring and generally in memory access operations. Starting from the writing or reading microprocessor, the feedback path comprises particularly the address lines up to the memory, the memory to be monitored and a return path from the peripheral address area back to the processor.

The access by the processor core to a memory module is known to be accomplished by a memory controller. The processor core and the memory controller are preferably part of a data processing system, particularly of a microcontroller.

Known memory controllers usually already contain registers which contain configuration data. These store values with the number of wait cycles, for example. The registered set of the memory controller is preferably supplemented with at least one address echo register for monitoring the address decoder. The semiconductor memory in line with the invention is thus preferably connected to a memory controller or contains a memory controller which comprises one or more configuration registers for monitoring the address decoder. After every memory access operation, the actually accessed address can be entered particularly into the address echo register.

Alternatively or in addition, the memory controller preferably comprises a complement address echo register. The complementary accessed memory address is written to the address echo register. The complement address register reflects error messages ("error flags") from the check on the addressing circuits. The microprocessor system expediently comprises means which allow the address echo register or the complement address echo register to be read.

The data processing system, which is connected to the memory controller, preferably comprises not only memory access means and address read-back means but also at least one comparison means, particularly at least one error recognition means, which recognizes an addressing circuit as error-free if the content of the address echo register or of the complement address echo register reproduces the address from the last memory access operation and, in particular, there is no error message. The microprocessor can perform this check at any time or preferably at regular intervals of time. The invention therefore also relates separately to an appropriately extended data processing system.

The address echo register and/or the complement address echo register preferably contains the following bit(s), with one or more of the bits being preferred individually or in any combination:

a) Address error bit. The address error bit forces an error when the address is recovered.
b) Complementary error bit. The complementary error bit forces an error when the complementary address is recovered.
c) Address mode bit. The address mode bit stipulates whether the address echo register is used for all memory access operations or just for erroneous memory access operations. In the latter case, the response applies not only to addressing errors but also to data errors, such as ECC errors.
d) Complement address mode bit. The complement address mode bit stipulates whether the complement address echo register is used for all memory access operations or just for erroneous memory access operations. In the latter case, the response applies not only to addressing errors but also to data errors, such as ECC errors.

With the forced errors, the processor can particularly easily check the integrity of the arrangement for monitoring addressing circuits at any time or preferably at regular intervals of time.

An important advantage of the embodiment described above is that a very high level of error coverage is achieved when monitoring addressing circuits without changes in the processor and in the interfaces thereof. The extensions in the memory and in the memory controller can be ported to any platforms without restriction.

The semiconductor memories according to aspects of the invention are preferably read/write memories or flash ROMs.

Preferably, the semiconductor memory also contains hardware means, such as particularly error storage means, such as error memories or error registers, which can be used to recognize errors in the addressing circuits following a memory access operation. This results in a short recognition time for addressing errors, which is particularly advantageous for applications with real-time capability and safety-critical applications. Particularly preferably, the actually accessed address and the applied address are stored in an error store immediately after an addressing error has been recognized, the error store being read for subsequent error analysis at a later time. Quite particularly preferably, this involves all available address values (i.e. actually applied address/subaddress, complementary and noncomplementary recovered address/subaddress) being stored in registers in the memory interface whenever an addressing error has been recognized.

In addition, the semiconductor memory according to aspects of the invention preferably contains hardware counting means which can be used to quantitatively ascertain the frequency of addressing errors. In addition, it is preferred for further hardware counting means to be present which can also be used to quantitatively ascertain the frequency of memory cells. The aforementioned counting means are present particularly in combination with one another.

For the error recognition, an additional bit line is preferably applied in the semiconductor memory for each bit position in the address. The addressing circuit also preferably comprises both row selection lines and column selection lines, with the relevant address bits being able to be reproduced externally by terminating the row and column selection lines using OR gates and/or address echo cells. This makes it possible to keep down the complexity for recovering address bits.

To form an address echo cell, a semiconductor element (for example a MOS transistor) is preferably connected at the crossover points between the additional bit line and an appropriate row or column selection line. Said semiconductor element expediently switches on if the relevant bit position is active for the row or column selection line under consideration. When a selection line is actively driven, a current flows through the additional bit line.

Additionally, sense amplifiers for the signals on the bit lines, which reproduce the actual access address, are also preferred.

The above semiconductor memory will preferably perform the safety-critical functions in microprocessor-controlled motor vehicle regulatory systems, or is used in computer-controlled real-time systems.

These and other aspects of the invention are illustrated in detail by way of the embodiments and are described with respect to the embodiments in the following, making reference to the Figures.

BRIEF DESCRIPTION OF THE DRAWINGS

The invention is best understood from the following detailed description when read in connection with the accompanying drawing. Included in the drawing are the following figures:

FIG. 1 shows a schematic illustration of the error recognition portion in the semiconductor memory according to aspects of the invention, FIG. 2 shows an error recognition portion of a memory according to aspects of the invention that has been modified in comparison with FIG. 1, FIG. 3 shows an address echo cell in the error recognition portion from FIG. 2.

DETAILED DESCRIPTION OF THE PREFERRED EMBODIMENTS

Figure 4:
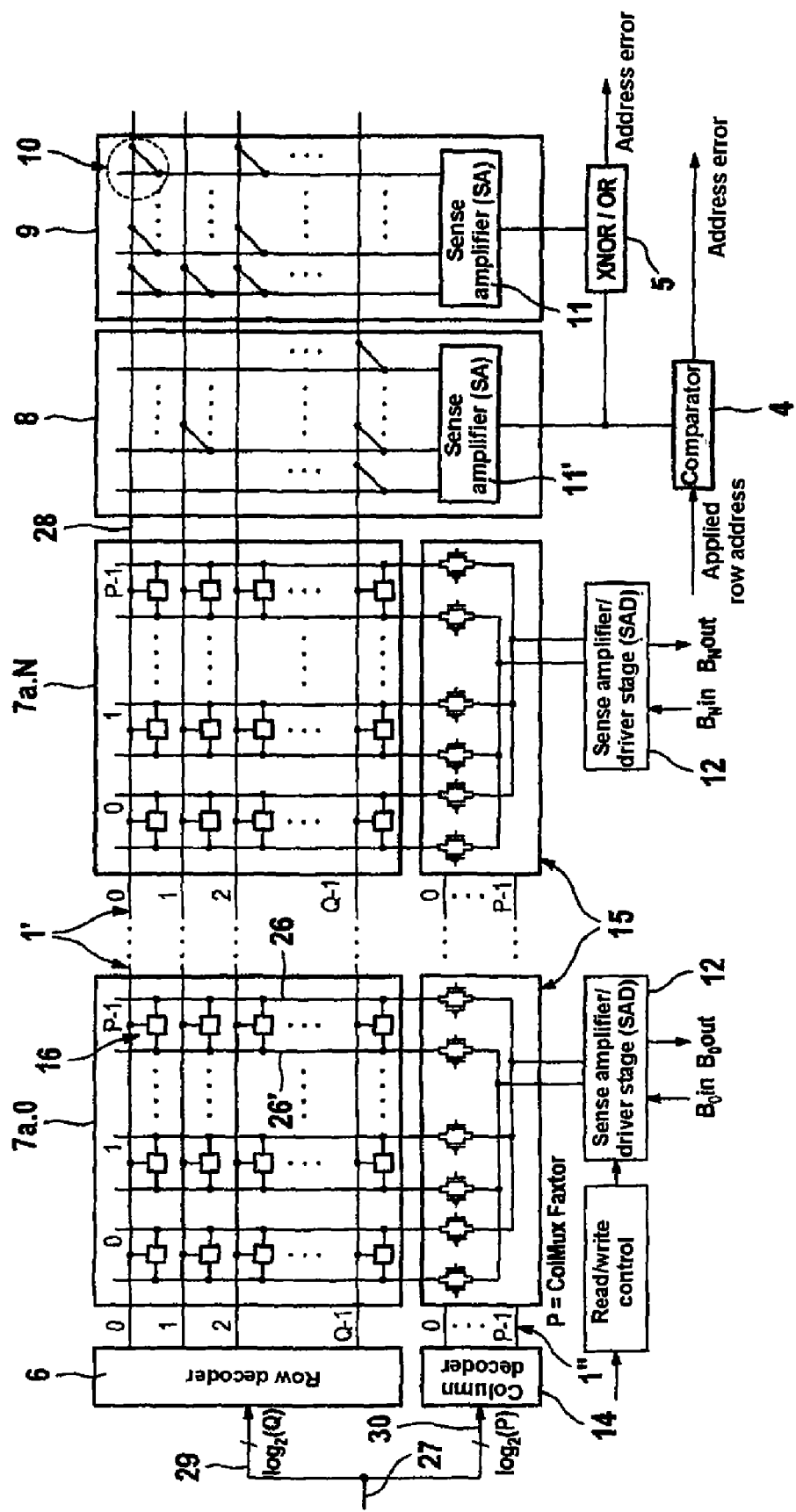
FIG. 4 shows an example of the incorporation of the error recognition portion shown in FIG. 2 into a conventional architecture of a semiconductor memory.

FIG. 1 shows eight column selection lines 1 (A, B, C, D, E, F, G and H) within an address decoder, as used in a semiconductor memory as shown in FIG. 4. From three applied address bits X, Y and Z, an address decoder (see FIG. 4—not shown in FIG. 1, respectively selects one of the eight selection lines 1. In this case, the selection lines 1 (A, B, C, D, E, F, G and H) respectively correspond to the addresses "000", "001", "010", "011, "100", "101", "110" and "111". The terminations of the eight selection lines 1 have the inputs of the OR gates 2, 2' and 2" connected to them. The outputs of the OR gates 2, 2' and 2" produce recovered address bits eX, eY and eZ from the address lines in accordance with the following scheme:

$$eZ = B + D + F + H$$

$$eY = C + D + G + H$$

$$eX = E + F + G + H$$

Accordingly, only every second line is supplied to an OR gate. The comparator 4 performs a first consistency check with the signals eX, eY and eZ, wherein the recovered address bits eX, eY and eZ are compared with the actually applied address bits X, Y and Z. If the compared bits do not all match, an address error is signaled on line 20.

However, there are address error patterns which cannot be recognized during the first consistency check by comparator 4. If a short circuit occurs between the selection lines E and F, for example, the corresponding address bits are respectively "100" and "101". The first consistency check can detect this short circuit as an address error only if memory access to the selection line E takes place. In the event of memory access to the selection line F, the first consistency check alone cannot recognize a short circuit between the two selection lines E and F. To obtain an even higher degree of coverage for the recognition of addressing errors, the error recognition is also performed on the basis of the complements using the additional OR gates 21, 21' and 21", the inputs of which are likewise connected to the terminations of the eight selection lines A, B, C, D, E, F, G and H, wherein the association with the lines is complementary with respect to the association of the gates 2. In this case, the lines which are omitted from the gates 2 are used. The three additional OR gates 21, 21' and 21" form the three complementary address bits eXc, eYc and eZc in accordance with the following association:

$$eZc = A + C + E + G$$

$$eYc = A + B + E + F$$

$$eXc = A + B + C + D$$

The recovered address bits eX, eY and eZ and their derived complementary values eXc, eYc and eZc are then supplied to a group of exclusive-OR gates 3 for a second consistency check (dashed block 5). The outputs 22 of the group of exclusive-OR gates 3 are supplied to the input of OR gate 23. The second consistency check 5 signals an error whenever the bits eX, eY, eZ and the bits eXc, eYc, eZc are not complementary with respect to one another. Overall, for eight selection lines, the second consistency check requires only seven OR gates with four respective inputs, an exclusive OR gate and an exclusive NOR gate (XNOR). On account of this small number of logic gates, the method according to aspects of the invention allows the addressing circuits to be checked in the same access cycle as the ongoing read or write operation. The error recognition circuit can also be applied to a higher number of selection lines on the basis of the above principle. However, it is then necessary to accept longer checking periods.

The error recognition portion of the semiconductor memory as shown in FIG. 2 corresponds very largely to the principle of the circuit in FIG. 1, but the circuit implementation has been optimized even further. There are essentially differences here with respect to the logic combinations, shown in FIG. 1, for the selection lines using OR gates 2 and 21. The error recognition circuit in FIG. 2 allows error recognition even with a much higher number of row selection lines (for example more than 256) within a single read/write cycle. The circuit shown is based in principle on the error recognition device in FIG. 1, but with the circuit being extended. For the purpose of simplified illustration, only eight row selection lines A, B, C, D, E, F, H and G are shown (reference symbol 1'). In addition to the circuit in FIG. 1, the address lines have bit lines 13 connected to them on the basis of the principle of a bit matrix. Each crossover point between row selection line (bit line; for example point 24) contains an address echo cell 10. The address echo cells 10 result in firm programming of the address bits at the end of each individual row selection line and form a structure with logic NOR functions.

Within the encoder 8, the bit lines 13 connected to the row address lines are amplified by means of sense amplifiers 11 and 11'. Sense amplifier 11' comprises logic inverters, since the OR function is output in negated form in the address echo cells 10. A bit value "1" or a bit value "0" can be read in an address echo cell 10. Sense amplifier 11' for the address lines corresponds very largely to the design of a conventional data sense amplifier 12, but with slight adjustments being required.

A further encoder 9 stipulates the complementary bits for the row address. In this case too, an inverting sense amplifier 11 is connected to the address echo cells 10. Encoder 8 forms the input lines eX, eY and eZ shown in FIG. 1 for the first consistency check 4. Encoder 9 forms the complementary lines eXc, eY and rZc for the second consistency check 5. It will be noted here that the arrangement of address encoding modules 8 and 9 at the terminations of the selection lines allows complete addressing paths to be monitored.

The speed advantage of the circuit in FIG. 2 results from the required address information being obtained from the memory matrix 7 in a very similar manner to data bits.

FIG. 3 shows the design of an address echo cell 10. Address echo cell 10 comprises a single MOS transistor 25. The gate connection of the MOS transistor is connected to row selection line 1', while the drain electrode is connected to the bit line 13'. The source electrode is connected to a reference potential.

The illustration in FIG. 4 shows the implementation of the error recognition portion shown in FIG. 2 in an inherently known architecture of a semiconductor memory (SRAM, DRAM, ROM, Flash ROM). The memory cells 16 are situated at the crossover points between the row selection lines 1 and the column selection lines 26, 26'. For a word length of N bits, the architecture is split into N submatrices 7a.0 ... 7a.N, so that each submatrix stores a bit position for a word which is to be written or to be read. The submatrix (7a.0) therefore stores all the bits at position zero for all the words.

For a number comprising Q row selection lines 1, $\log_2 Q$ row selection bits 29 are required from the address bits 27. These are decoded by row decoder 6 and join row selection lines 1'. At the terminations 28 of the row selection lines 1', the error recognition circuit shown in FIG. 2 is connected. The encoders 8 and 9 and also the sense amplifiers 11 and 11' have likewise already been explained in connection with FIG. 2. The first and second consistency checks (reference symbols 4 and 5) also correspond to the circuit example in FIG. 2.

The memory shown in FIG. 4 also comprises a column decoder 14 which is connected to column selection lines 1". The column selection lines 1" are used to actuate the column multiplexers 15. In line with the error monitoring for the row selection lines 1', it is now also possible to monitor the column selection lines 1" on the basis of the principle in FIG. 1 or 2. For P column selection lines, $\log_2 P$ column address bits 30 are required.

Usually, the number of column selection lines 1" is much smaller than that of row selection lines 1'. In cases of memory architectures with a small number of column selection lines, the circuit example in FIG. 1 may be advantageous over the circuit example in FIG. 2 at least for the error recognition for the column selection lines.

Figure 5:
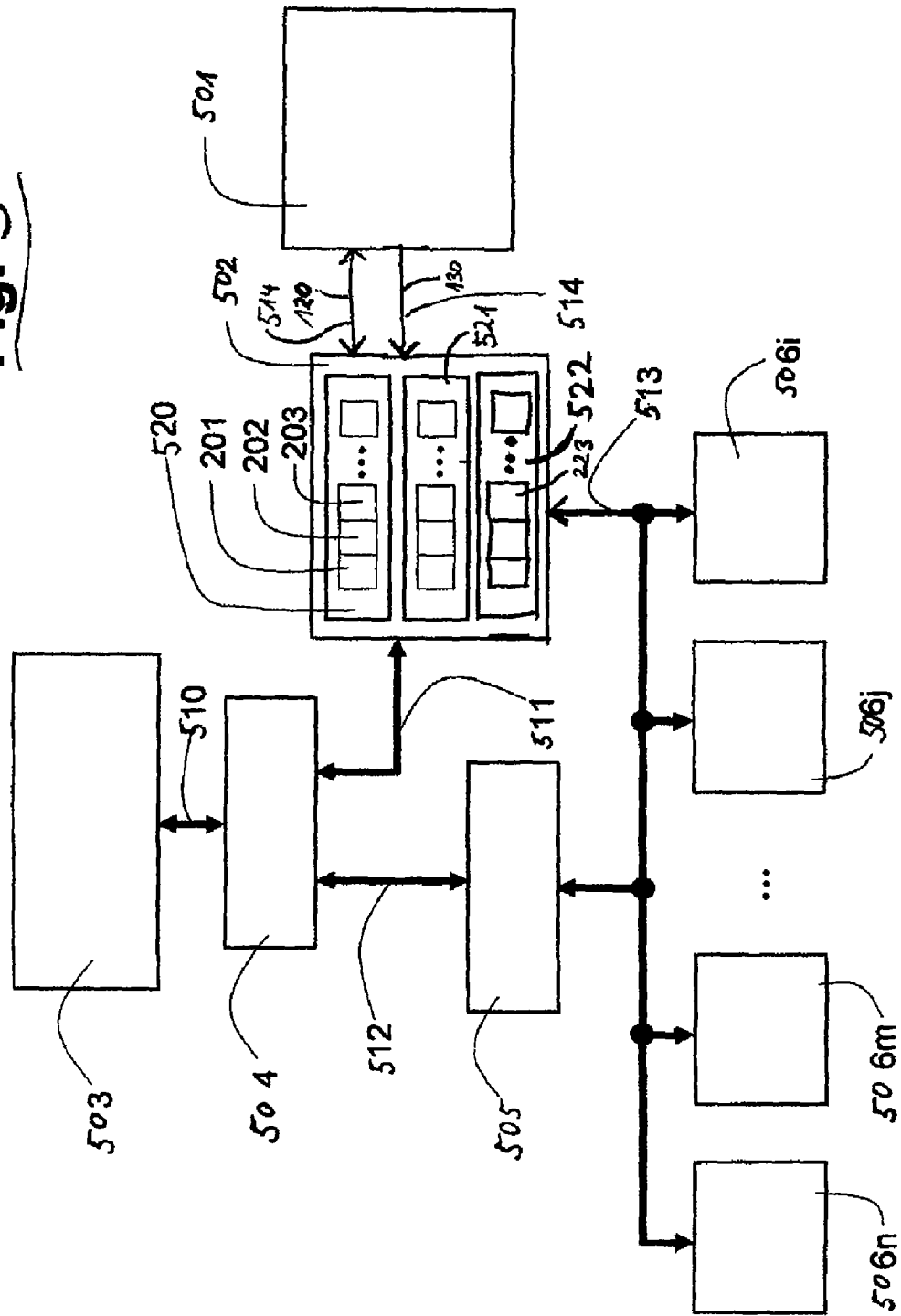
FIG. 5 shows a data processing system extended in accordance with aspects of the invention.

FIG. 5 is used to show the basic hardware architecture of an exemplary data processing system, which is a microcontroller, in particular. Processor 503 is connected to bus matrix 504 by means of bus 510. By way of example, bus 510 may be implemented on the basis of the AHB (Advanced High-Performance Bus) protocol. The slave end of the bus matrix 504 may have various modules connected. For the sake of simplicity, only the two slave modules that are the peripheral bridge 505 and the memory controller 502 are shown. The buses 511 and 512 can use the same bus protocol as bus 510. Memory controller 502 and memory 501 are connected by means of the local bus 514. In many known architectures, the registers of the memory controller 502 connected to memory 501 can be read and written to as registers from the peripheral units 506n, 506m, 506j and 506i using the peripheral bus 513 and the peripheral bridge 505. The number of wait cycles for memory access operations by means of configuration register can be set in the memory controller 502.

Memory controller 502 has the following registers:
address echo configuration register 520,
address echo test register 521 and
complementary address echo register 522.

The address echo configuration register 520 contains the following bits:
address error bit 201
complementary error bit 202
address mode bit 203.

Similarly, appropriate bits are also provided in the registers 521 and 522. The address error bit 201 forces an error during recovery of the address. The complementary error bit 202 forces an error during the recovery of the complementary address. The address mode bit 203 stipulates whether the address echo test register 521 is used for all memory access operations or only for erroneous memory access operations. In the latter case, the method is valid not only for addressing errors but also for data errors, such as ECC errors. The complement address mode bit 223 stipulates whether the complementary address echo register 522 is used for all memory access operations or only for erroneous memory access operations. In the latter case, the method is valid not only for addressing errors but also for data errors, such as ECC errors.

Following a memory access operation, values of address bits can be held in the address echo test register 521. Values of the complementary address bits can accordingly be held in the complementary address echo register. For this, the interface 120 which is present between the memory controller 502 and the memory 501 is extended by the echo address lines 130.

Microprocessor 503 can use the signal path denoted by the with the reference symbols 510, 504, 512, 505 and 513 to check whether the addressing circuit in memory 501 is working properly. In this case, the address lines and the progression thereof through the bus matrix 504 and the memory controller 502 are also checked. The checking loop arising (access from the processor to memory and values of the actual accessed address back to the processor) together with the means for monitoring the addressing circuit which are implemented in the memory provide a higher level of error coverage than known methods.

Figure 6:
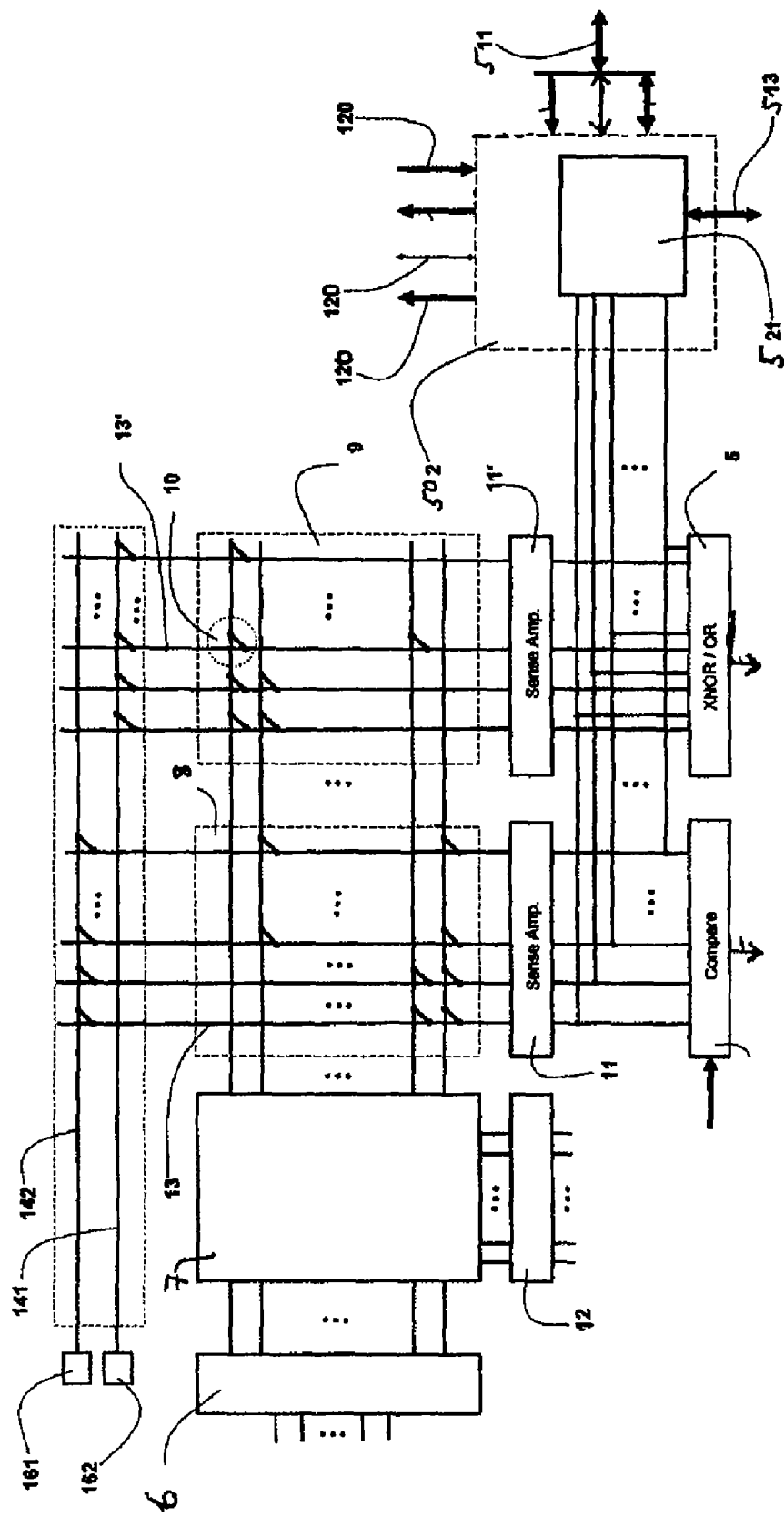
FIG. 6 shows an extended addressing circuit for stimulating addressing errors using configuration bits.
Figure 7:
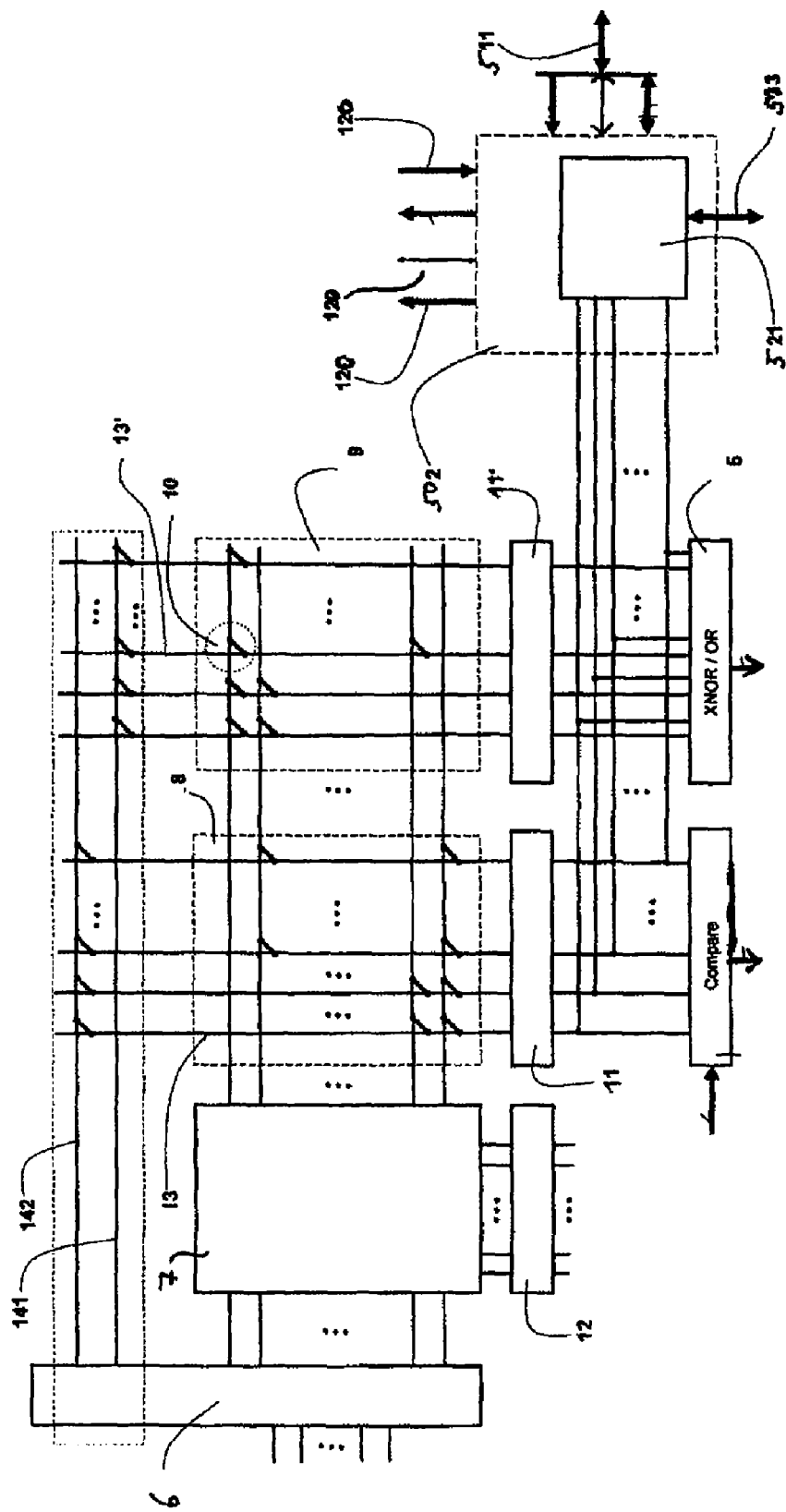
FIG. 7 shows a further addressing circuit for stimulating addressing errors that has been simplified in comparison with FIG. 6.

FIGS. 6 and 7 show two exemplary variants of circuits for monitoring the memory addressing circuit within the memory 501. The basic design of the memory is described further above in connection with FIG. 2. The actually accessed address is returned to the memory controller 502 by means of the echo address lines 130. The complement value of the actually accessed address is returned in the same manner (not shown in FIG. 6). Addressing errors can be injected manually, that is to say as provoked or stimulated errors, by means of the additional selection lines 141 and 142. To this, the line drivers 161 and 162 are connected. Driver 161 is actuated by means of the address error bit 201 in the address echo configuration register 520. Accordingly, the complementary error bit 202 in the address echo configuration register 520 actuates the driver 162.

Apart from the area around the row decoder 6, the memory addressing circuit in FIG. 7 corresponds to the circuit in FIG. 6. For some implementations, the address space associated with the memory may be larger than the actually implemented memory address area. In this case, two unused address lines of the row decoder 6 are connected to the selection lines 141 and 142. In this way, it is possible to provoke addressing errors with the address decoder. The configuration bits that are the address error bit 201 and the complementary error bit 202 are no longer required in the circuit shown in FIG. 7.

While preferred embodiments of the invention have been described herein, it will be understood that such embodiments are provided by way of example only. Numerous variations, changes and substitutions will occur to those skilled in the art without departing from the spirit of the invention. It is intended that the appended claims cover all such variations as fall within the spirit and scope of the invention.

The invention claimed is:

1. A data processing system having a semiconductor memory with a memory matrix which is addressed by an addressing circuit which comprises addressing lines, wherein the memory comprises additional bit lines for recovering the address/subaddress, and the data processing system comprises a device for recognizing and/or correcting addressing errors with means for comparing a read-back address/subaddress and an applied address/subaddress, wherein the data processing system comprises a microprocessor, memory access means, address read-back means and comparison means which the microprocessor can use to read back and check the actual memory access address from the semiconductor memory, wherein the semiconductor memory has an addressing circuit having at least one feedback path for checking the addressing circuit, wherein the feedback path is routed from the microprocessor via a first bus to a bus matrix, a second bus to a peripheral bridge, via a peripheral bus to a memory controller and via address echo lines to the semiconductor memory, which is provided in addition to a first path routed via a third bus between the bus matrix and the memory controller, wherein the actually accessed address is returned to the memory controller by way of the address echo lines, and wherein the address echo lines extend an interface which is present between the memory controller and the memory.

2. The data processing system as claimed in claim 1 further comprising hardware distinguishing means that are configured to:
(i) allow explicit distinction between data bit errors and addressing errors,
(ii) allow quantitative detection of these errors, or
(iii) any combination thereof.

3. The data processing system as claimed in claim 1, wherein a crossover point between the additional bit lines and the addressing lines contains address echo cells.

4. The data processing system as claimed in claim 1, wherein tap-off lines are connected to inputs of one or more OR gates.

5. The data processing system as claimed in claim 1 further comprising a first test circuit which is connected to a second test circuit, wherein the first test circuit compares the addresses/subaddresses recovered using the additional bit lines with the applied addresses/subaddresses, and the second test circuit processes complementary addresses/subaddresses from the additional bit lines.

6. The data processing system as claimed in claim 1, wherein an additional bit line is applied for each bit position in the address.

7. The data processing system as claimed in claim 1, wherein the addressing lines comprise both row selection lines and column selection lines, and the row selection lines and column selection lines are respectively connected to the additional bit lines for error recognition.

8. The data processing system as claimed in claim 1, wherein hardware means are present which can be used to recognize errors in the addressing circuits following a memory access operation.

9. The data processing system as claimed in claim 8, wherein the hardware means comprise error storage means.

10. The data processing system as claimed in claim 1, wherein the semiconductor memory is connected to the memory controller or contains the memory controller, and wherein the memory controller which comprises one or more configuration registers for monitoring an address decoder.

11. A method performed by the data processing system of claim 1, wherein a core structure of the semiconductor memory comprises the memory matrix with the addressing lines for accessing individual memory cells in the memory matrix, said method comprising the following steps:
selecting logic levels on the addressing lines;
accessing the selected address or subaddress of the selected addressing lines by way of a plurality of address bit lines;
recovering the accessed address/subaddress using the address bit lines;
obtaining an applied address/subaddress from the address bit lines; and
comparing the accessed address/subaddress with the applied address/subaddress in order to recognize errors in the addressing of the semiconductor memory,
wherein the feedback path from the microprocessor via the first bus, the bus matrix, the second bus, the peripheral bridge, the peripheral bus, the memory controller and the address echo lines to the semiconductor memory is used to access the selected address or subaddress, and
the accessed address/subaddress is returned by way of the address echo lines to the memory controller, and
the address echo lines extend the interface which is present between the memory controller and the memory.

12. The method as claimed in claim 11 further comprising the step of recovering the accessed address/subaddress in the form of bit complements.

13. The method as claimed in claim 11 further comprising the step of drawing a distinction between addressing errors and data bit errors.

14. The method as claimed in claim 12 further comprising the step(s) of:
processing complemented and uncomplemented bits such that the complemented and uncomplemented bits are supplied to OR gates; and/or
processing complemented and uncomplemented bits such that besides the memory matrix an additional encoding matrix and an additional complement encoding matrix are provided.

15. The method as claimed in claim 11 further comprising the step of recognizing an addressing error in the same access cycle as a read or write operation.

16. The method as claimed in claim 11 further comprising the step of storing in a respective register:
(i) a read-back address accessed during a memory access operation,
(ii) a complementary accessed read-back address, or
(iii) any combination thereof,
wherein a memory access operation is considered error-free if a register content corresponds to an access address or to the complement of the access address.

17. The method as claimed in claim 11, wherein the selecting step further comprises selecting logic levels on the terminations of the addressing lines.

18. The method as claimed in claim 11, wherein addressing errors are supplied to the semiconductor memory as stimulated errors by additional selection lines.

* * * * *